United States Patent [19]

Berhold

[11] Patent Number: 4,833,568

[45] Date of Patent: May 23, 1989

[54] THREE-DIMENSIONAL CIRCUIT COMPONENT ASSEMBLY AND METHOD CORRESPONDING THERETO

[76] Inventor: G. Mark Berhold, 7752 Steffensen Dr., Salt Lake City, Utah 84121

[21] Appl. No.: 150,227

[22] Filed: Jan. 29, 1988

[51] Int. Cl.$^4$ .............................................. H02B 1/00
[52] U.S. Cl. ..................................................... 361/383
[58] Field of Search .............................. 361/386–388, 361/398, 393–396, 410, 412, 413, 414

[56] References Cited

U.S. PATENT DOCUMENTS

| | | | |
|---|---|---|---|
| 2,703,853 | 3/1955 | Chrystie | 317/101 |
| 2,892,131 | 6/1959 | MacDonnell | 317/101 |
| 2,907,926 | 10/1959 | Slack | 317/101 |
| 3,384,956 | 5/1968 | Flanders et al. | 361/396 X |
| 4,085,433 | 4/1978 | Baranowski | 361/396 |
| 4,117,588 | 10/1978 | Johnson | 29/608 |
| 4,288,841 | 9/1981 | Gogal | 361/395 |
| 4,394,707 | 7/1983 | Consoli | 361/395 |
| 4,510,551 | 4/1985 | Brainard, II | 361/398 |
| 4,626,960 | 12/1986 | Hamano et al. | 361/395 X |

OTHER PUBLICATIONS

"TriQuest, Elite Allies in Molded 3-D Circuits", Electronic Engineering Times 61, (Nov. 30, 1987).
"Three-D Nolded Packages Have Build-In Circuitry", Electronic Engineering Times 25, (Nov. 30, 1987).
"Texas Instruments Goes 3-D Interconnects", Electronic Engineering Times 62, (Jan. 18, 1988).

Primary Examiner—Roy N. Envall, Jr.
Attorney, Agent, or Firm—Workman, Nydegger & Jensen

[57] ABSTRACT

A plurality of plate-like circuit component carrier packages having the same size and shape are stacked adjacent one to another with the flat faces thereof in contact to form a carrier package assembly in the form of a prismatic or cylindrically solid. Each carrier package houses one or more electrical circuit components and is provided at portions of the flat faces thereof with electrical contacts which cooperate with similarly located contacts on the flat faces of adjacent carrier packages to electrically interconnect the circuit components. The electrical contacts may take the form of a cooperating system of pins and apertures, serving also to align adjacent carrier packages. The carrier package assembly is useable in cooperation with a flexible, printed circuit board having on one side thereof an array of contact sites selectively interconnected by printed routing traces. Electrical contacts on the peripheral surfaces of the carrier packages are coupled with the circuit components housed therein and engage the contact sites on the circuit board when it is wrapped around the carrier package assembly. The ends of the carrier package assembly are fitted with connector blocks of a convenient shape which serve to support the carrier package assembly and to interconnect the electrical components therein with others exterior thereto. Several types of circuit boards and a variety of carrier package shapes are disclosed.

64 Claims, 3 Drawing Sheets

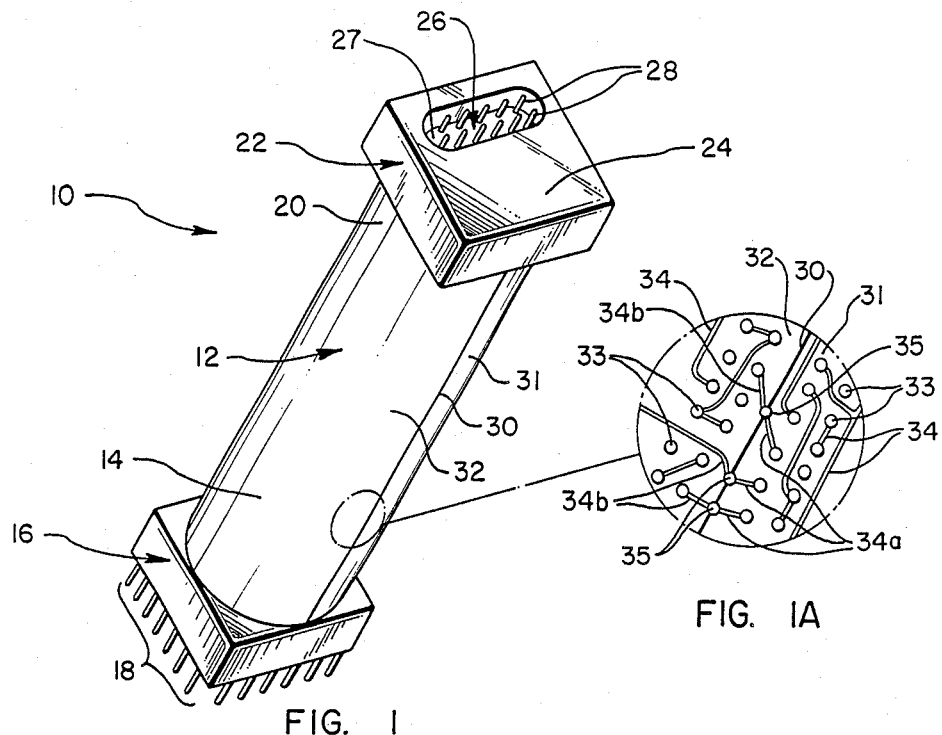
FIG. 1
FIG. 1A
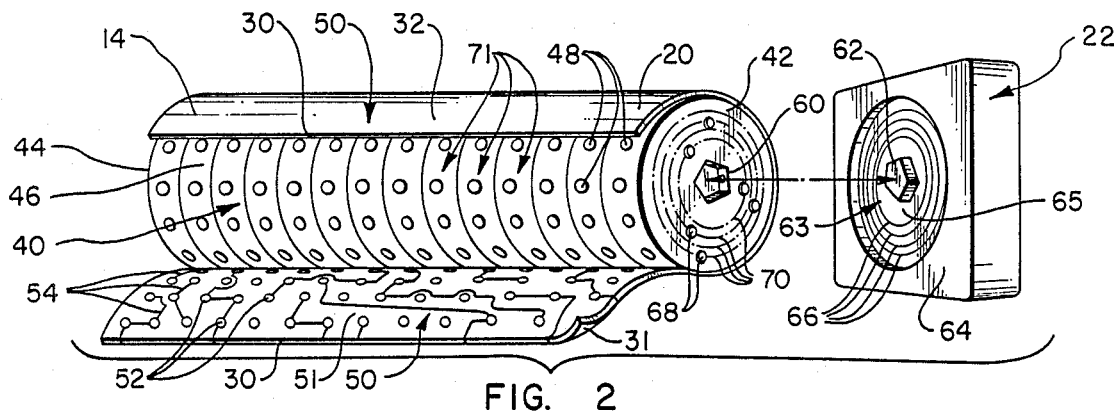
FIG. 2
FIG. 3

THREE-DIMENSIONAL CIRCUIT COMPONENT ASSEMBLY AND METHOD CORRESPONDING THERETO

BACKGROUND OF THE INVENTION

1. Field of the Invention

The present invention relates to the assembly in a single electronic device of a plurality of circuit components, and more particularly to the compact assembly of such circuit components in close proximity one with another in a three-dimensional spatial relationship.

2. Background Art

Complex electronic devices usually unvolve a plurality of distinct circuit components which must be electrically interconnected in order to achieve the objectives of the device. Increasingly, such circuit components are themselves complex electrical subsystems, taking the form of integrated circuit semiconductor chips. Whether interconnecting semiconductor chips or discrete circuit components of the traditional type, every effort is made to place such circuit constituents in close proximity one to another. This is undertaken in order to reduce the overall size of the electronic device which the circuit constituents comprise, to reduce the quantity of electrically conductive material required to effect interconnection of the circuit constituents, and preferably to group together in a standard, electrically interconnected arrangement circuit constituents that together perform an identifiable electrical function. In high speed electronic devices the separation between circuit components is minimized in order to reduce the time required for signals to be communicated between those devices.

Typically, plural circuit components are electrically interconnected by their attachment to conductive pads or contact apertures on a rigid planar printed circuit board. Where the circuit components are of the traditional discrete variety, soldering, fusion, or the application of conductive paste, epoxy, elastomer, or cement to conductive surfaces on an individual basis is required in order to effect this attachment. Because of the small size and large number of leads, wires, or connection points involved in the typical integrated circuit semiconductor chip, however, such devices are not always attached to printed circuit boards directly.

Integrated circuit semiconductor chips are traditionally mounted on, embedded in, or attached to a semiconductor chip carrier package having electrical insulating capability. Electrically conductive pathways comprising variously pins, wires, or printed conductive routing traces are electrically connected to contact points on the integrated circuit semiconductor chip and extend therefrom to the exterior of the carrier package. The pins, wires, traces, or other electrical contact points on the exterior of the package or carrier may then be inserted into sockets in receptacle housings, or chips, which have already been secured to the circuit board and electrically interconnected to the conductive routing traces thereon. Such integrated circuit semiconductor chip carrier packages may also be attached or electrically interconnected directly to conductive pads and apertures on the printed circuit board by the methods mentioned above in relation to the attachment of traditional discrete circuit components to circuit boards.

While the process of inserting a semiconductor chip carrier package into a receptacle housing is not particularly arduous, the securing of such receptacle housings or the semiconductor chip carrier packages directly to a circuit board can be quite tedious and time consuming. In many instances advanced robotics or other automated methods of drilling and attachment must be employed.

As the number of circuit components in an electronic device increases, the size and complexity of the printed circuit board to which the circuit components are attached is similarly affected. This results in the need for multiple layers of conductive traces in the circuit board employed. The physical separation between circuit components also increases, particularly between those components at the opposite ends of the same sides of the circuit board, lengthening the conductive routing traces electrically connecting the circuit components. Signal delay, heat dissipation, and fabrication complexity thereby become potential problems.

If the expanse of the circuit board required exceeds the area allocated for it in the housing of the overall device, then a complementing assembly strategy is employed. This involves the design and fabrication of a plurality of distinct circuit boards mounted over or next to one another on posts, or inserted by the edges thereof into some other form of upstanding support bus or channel. Electrical interconnection between such circuit boards is generally achieved through the support structure therebetween.

Nevertheless, in such arrangements each circuit board with its own plurality of attached circuit components projecting from the surface thereof is a delicate article to handle, assemble, or service. Space must be maintained between each of the circuit boards to accommodate for the circuit components attached thereupon. Such a method of circuit component assembly is disclosed in U.S. Pat. No. 2,907,926.

While the electrical interconnection of circuit components on a single circuit board is substantially two-dimensional in nature, the stacking of circuit boards in the manner described introduces among the circuit components involved a third dimension in which that interconnection can occur, one normal to the planes of the circuit boards. In this third dimension electrical interconnections can be effected, potentially rendering the conductive trace patterns on the circuit boards themselves less complex and advantageously reducing the average electrical distance among circuit components by shortening the length of some interconnecting traces. Signal transfer times between some circuit components can possibly be kept within smaller limits than with other methods of circuit component assembly. This is particularly advantageous in complex electronic devices.

Nevertheless, while the circuit component assembly technique illustrated in U.S. Pat. No. 2,907,926 does enable a circuit designer to place a large number of circuit components in close spatial relation one to another, that technique remains limited by the disadvantages inherent in its traditional use of printed circuit boards. As mentioned earlier, these include the difficulty of attaching components to circuit boards and the fragility of the resulting structure with those components projecting from the surface thereof. The complexity of fabrication and assembly associated with this method is also greatly increased.

This latter aspect of circuit board utilization requires the maintenance between each circuit board of a substantial volume of unused space so that circuit components attached to one circuit board will not encounter those on an adjacent board. Additionally, auxiliary support structures must be interposed between circuit levels to hold the circuit board layers apart from one another. As a result, space in electronic devices is not maximally utilized. These considerations limit the capacity of stacked circuit board arrangements to densify the circuit components involved.

Alternatively U.S. Pat. No. 4,510,551 discloses the use of a flexible printed circuit board to which circuit components are mounted in columns on conductive pads arrayed in parallel lines in the traditional manner. The circuit board is then rolled upon itself with an insulation layer interposed therebetween about an axis parallel to the lines of those conductive pads, producing a spatially compact cylindrical arrangement of electrical circuit components. A rigid cylindrical housing encloses the rolled circuit board to maintain its physical integrity.

Despite the close spatial relationship that results among circuit components in this circuit component assembly, the interconnection between circuit components is limited to the use of conductive routing traces in the two-dimensional plane of the unrolled circuit board. Accordingly, while some spatial densification of the circuit components mounted on the circuit board can be effected in this manner, those components remain in an electrical sense as remote from one another as if mounted on a rigid planar circuit board. Components at remote ends of the board, while possibly close together in a spatial sense once the board is rolled up, are still separated electrically by conductive traces that must traverse the full length of the circuit board. The method disclosed is also still affected by the disadvantages of the traditional way in which circuit components are attached to circuit boards, and the fragility of the circuit board with the attachments thereto continues to inhibit easy assembly and maintenance.

SUMMARY OF THE INVENTION

One object of the present invention is to produce an assembly of a plurality of circuit components in which such components are in close three-dimensional spatial proximity.

Another object of the invention is a spatially compact assembly of circuit components in which such components are in addition proximate electrically, being interconnected by relatively short conductive traces.

Still another object of the present invention is a three-dimensional circuit component assembly as described above which does not require not customized or more complex methods of component soldering, fusion, or attachment, as are encountered in attaching circuit components to conventional circuit boards.

Yet another object of the invention is to create a three-dimensional circuit component assembly which minimizes unused space between levels of the assembly.

One object of the present invention is an assembly of circuit components as described above in which printed circuit board space is minimized and the average length of conductive traces thereon is reduced relative to a planar printed circuit board.

An additional object of the present invention is to simplify the fabrication of a plurality of electrical circuit components into a single electronic unit.

Yet another object of the present invention is to alleviate specialized supportive structures for circuit board layers in a complex electronic device requiring a plurality of planar circuit boards with electronic components attached thereto.

An additional object of the present invention is an electrical circuit component carrier package which is sturdy, protective of the circuit components associated therewith, and readily interconnectable electrically to other similar carrier packages without custom soldering, fusion, or attachment.

Additional objects and advantages of the invention will be set forth in the description which follows, and in part will become apparent from the description, or may be learned by the practice of the invention. The objects and advantages of the invention may be realized and obtained by means of the instruments and combinations particularly pointed out in the appended claims.

To achieve the foregoing objects, and in accordance with the invention as embodied and broadly described herein, a three-dimensional circuit component assembly is provided comprising a plurality of circuit component carrier packages, each of which houses one or more circuit components, preferably by embedment in the carrier package. In one embodiment of the invention, the carrier packages are of a plate-like configuration, having a pair of opposed congruent parallel faces.

The carrier packages are positioned to form a carrier package assembly with one of the faces of each carrier package contacting one of the faces of at least one other carrier package. Ideally, if the faces of all carrier packages are congruent, faces of adjacent carrier packages in the carrier package assembly may be aligned in a mating relationship, so that a prismatic or cylindrical stack results. Coupling means are provided for electrically interconnecting the electrical circuit components in the carrier packages of the carrier package assembly.

The coupling means of the present invention comprises in one embodiment of the invention one or more contacts on the outer surface of each of the carrier packages. These contacts may take the form variously of pads, pins, or receptacles which are electrically coupled to the circuit component or components housed in each carrier package. Such contacts may be located on the faces of the carrier packages, so that the contacts on adjacent faces of successive carrier packages in the carrier package assembly engage one another. Alternatively or additionally, the contacts may be located on the sides of the carrier package assembly at the periphery of each individual carrier package.

Electrical contacts on the sides of the carrier package assembly are electrically interconnected by a wrapping means. In one embodiment of the present invention, such a wrapping means comprises an electrical insulative substrate encircling the sides of the carrier package assembly. Contact sites on the side of the substrate adjacent the carrier package assembly engage the contacts on the sides of the carrier package assembly and are selectively interconnected by conductive routing traces on the substrate. The conductive routing traces may be arrayed in a plurality of layers in or on the substrate, and the substrate itself may comprise a continuous flexible planar member which is wrapped around the carrier package assembly or a thin-walled tubular member fitted thereto.

Thus, the invention comprises an efficient arrangement for the assembly of a plurality of circuit components using a single circuit board. In the invention, however, the circuit board, rather than being a structural element on which circuit components are individually mounted, serves as a flexible connection means between various levels of a self-supporting carrier package assembly of the circuit components in durable protective carrier packages, preferably of a standard size and shape.

Levels of the assembly can be electrically interconnected either through contacts on the faces of the carrier packages, which cooperate with similarly located contacts on the faces of adjacent carrier packages, or through contacts on the sides of the carrier packages which engage selectively interconnected contact sites on a circuit board wrapped around the carrier package assembly. Uniform angular displacement of the contacts on the sides of the carrier packages about the circumference thereof permits the contact points on the circuit board to be arranged in a uniform matrix, facilitating manufacture and assembly.

The carrier packages may be of any convenient configuration, but should for best advantage be similar in size and shape to each other. The assembly of such carrier packages into a carrier package assembly can be facilitated through the provision of a register means which aligns successive carrier packages with the faces thereof in a mating relationship.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these depict only typical embodiments of the invention, and are therefore not to be considered limiting of its scope, the subject invention will be described with additional specificity and detail through use of those drawings in which:

FIG. 1 is a perspective view of one embodiment of a three-dimensional circuit component assembly incorporating the teachings of the present invention;

FIG. 1A is a detail view of a portion of the surface of the circuit component assembly shown in FIG. 1;

FIG. 2 is a partially disassembled perspective view of the circuit component assembly shown in FIG. 1;

FIG. 3 is a further disassembled perspective view of the circuit component carrier packages of the circuit component assembly of FIGS. 1 and 2;

DESCRIPTION OF THE PREFERRED EMBODIMENT

Figure 4:
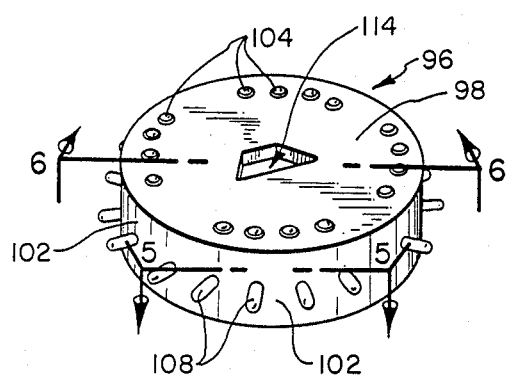
FIG. 4 is a perspective view of an alternative embodiment of a circuit component carrier package incorporating additional teachings of the present invention.

One embodiment of a three-dimensional circuit component assembly 10 incorporating teachings of the present invention is shown fully assembled in FIG. 1. The constituent elements of circuit component assembly 10 will be illustrated and described subsequently by reference to FIGS. 2 and 3 which illustrate some of those elements in a partially disassembled relationship. By reference to FIG. 1, however, circuit component assembly 10 can be seen to comprise a self-supporting prismatic central portion 12 which houses a plurality of circuit components (not shown) in a highly densified three-dimensional spatial relationship. Central portion 12 is in actuality cylindrical in shape. Nevertheless, the term "prismatic" used throughout this disclosure and the claims thereafter in relation to a three-dimensional circuit component assembly will mean all solids exhibiting congruent cross-sections in planes taken parallel one to another, including both solids, such as circuit component assembly 10 having curved sides, and solids as subsequently disclosed herein having straight sides.

On a first end 14 of central portion 12 is mounted a connector block 16 which is electrically coupled with the circuit components housed in central portion 12. Connector block 16 serves the dual functions of supporting circuit component assembly 10 when it is installed in an electronic device and of interconnecting the electrical circuit components housed in central portion 12 with circuitry exterior thereto. Toward this end the face of connector block 16 remote from first end 14 of central portion 12 is provided with a plurality of installation pins 18 or any other suitable type of electrical connector which may be received in a correspondingly patterned receptacle when circuit component assembly 10 is installed in an electronic device.

On second end 20 central portion 12 opposite from connector block 16 is mounted a cap 22. Where it is desirable to further interconnect the circuit components housed in central portion 12 with circuitry exterior to circuit component assembly 10, cap 22 may be provided on the outer face 24 thereof remote from connector block 16 with a structure to which electrical interconnections may be selectively effected. Toward this end connector block 16 may include a connector of standard national or international pattern. Such structure may also take the form shown of a recess 26 having a floor 27 from which project a plurality of upstanding conductive posts 28. Posts 28 are electrically interconnected through block 22 to the circuit components housed in central portion 12. Cap 22 and connector block 16 may, depending on the application involved, be interchangeable one with another both functionally and physically with respect to first and second ends 14, 20, respectively, of central portion 12.

On the surface of central portion 12 a seam 30 extends from cap 22 to connector block 16 between the opposed portions 31, 32 of the surface of central portion 12 to either side of seam 30 thereof. In many applications a seam, such as seam 30 might not be visually appreciable. Nevertheless, seam 30 has been included in FIG. 1 in order to afford an improved understanding of the structure of circuit component assembly 10. The surface of central portion 12 might also in some applications include structure omitted for clarity of explanation from FIG. 1, but shown in the detail view of seam 30 illustrated in FIG. 1A.

In FIG. 1A it can be seen that the surface of central portion 12 on both sides of seam 30 includes a plurality of conductive pads interconnected on a selective basis by electrically conductive routing traces 34 which are in turn coupled to the electrical circuit components housed in central portion 12. Routing traces, such as routing traces 34A which approach the edge of portion 31 of the surface of central portion 12 and routing traces 34B which approach the edge of portion 32 of the surface of central portion 12 are electrically connected to each other by a conductive bead 35 joining opposed routing traces 34A and 34B across seam 30. Conductive bead 35 may be produced in any conventional fusion or bonding process and may thus comprise solder or a conductive paste, epoxy, elastomer, or adhesive. Seam 30 itself may be created prior to the formation of conductive beads 35 by sealing or fusing opposed portions 31, 32 of the surface of central portion 12 to one another to create a single continuous surface about the circumference of central portion 12.

The nature of seam 30 and the interior structure of circuit component assembly 10 will be explored in further detail by reference first to FIG. 2, wherein connector block 16 (not shown) and cap 22 have been detached from central portions 12 and portions 31, 32 of the surface of central portion 12 have been disconnected to open seam 30.

Central portion 12 is thus revealed to be comprised of a structurally self-supporting prismatic core 40 or housing having parallel end surfaces 42, 44 and curvilinear sides 46 normal thereto. Prismatic core 40 is cylindrical in configuration. The circuit components housed in central portion 12 are thus more specifically located in core 40. Curvilinear sides 46 of core 40 are provided with a plurality of circumferentially arrayed rows of contacts 48 which are electrically interconnected with the circuit components housed in core 40. In the embodiment shown in FIG. 2 contacts 48 are depicted as circular conductive pads that are relatively flush with the surface of curvilinear sides 46 and are advantageously displaced about sides 46 of core 40 in a uniform manner.

In accordance with one aspect of the present invention, circuit component assembly 10 is provided with a wrapping means for electrically interconnecting selected ones of contacts 48, whereby to electrically interconnect the circuit components housed in core 40. As shown by way of example and not limitation, a flexible, electrically insulative substrate 50 encircles core 40 against curvilinear sides 46 thereof. The inner surface 51 of flexible substrate 50 engages core 40 and has printed or otherwise provided thereon a plurality of contact sites 52 corresponding in pattern to the layout of contacts 48. Conductive routing traces 54 selectively interconnect contact sites 52.

When flexible substrate 50 circumferentially encircles curvilinear sides 46 of core 40, contact sites 52 on substrate 50 engage contacts 48 on core 40. Through conductive routing traces 54 the circuit components housed within core 40 are thus in turn electrically interconnected with each other. This interconnection can occur both circumferentially of core 40, about curvilinear sides 46, and longitudinally of core 40 in a direction parallel to the axis thereof. As the circumferential interconnections are not linear, but instead curve about core 40, these circumferential interconnections in combination with interconnections longitudinal of core 40 offer three dimensions in which to effect electrical interconnections among the circuit components housed within core 40. Flexible substrate 50 with contact sites 52 and conductive routing traces 54 thereupon thus functions as a cylindrical circuit board for interconnecting the circuit components housed in core 40.

The uniform displacement of contacts 48 about the periphery of core 40 will result in contact sites 52 on flexible substrate 50 being arrayed in a uniform matrix thereon. This in turn simplifies the manufacturing processes associated with producing a circuit board, such as flexible substrate 50, as well as the assembly of the circuit board to a core in which circuit components are housed.

FIG. 2 illustrates one manner in which cap 22, as well as connector block 16 (not shown), may be mechanically attached to and electrically interconnected with core 40. By way of example and not limitation, end surface 42 of core 40 may be provided with a centrally located female recess 60 into which snaps a similarly shaped centrally located male fitting 62 on cap 20. Male fitting 62 projects from the floor 63 of a cylindrical recess 64 in the face 65 of cap 20 adjacent to core 40. Snapping of male fitting 62 into female recess 60 brings end surface 42 of core 40 into contact with the floor 63 of recess 64. It is through such contact that an electrical interconnection is effected between cap 22 and the circuit components housed in core 40.

In the embodiment shown, female recess 60 and male fitting 62 are of a regular pentagonal shape. Accordingly cap 22 may be attached to core 40 in a variety of different angular orientations. This requires that the electrical interconnection between core 40 and cap 22 be angularly non-specific. By way of example, toward this end floor 63 of recess 64 is provided with a plurality of concentric, electrically conductive annular contacts 66 arrayed about male fitting 62 which are connected through block 22 to upstanding conductive posts 28 shown in FIG. 1. In FIG. 2 four such annular contacts 66 are shown.

Correspondingly, end surface 42 of core 40 includes a plurality of cap contacts 68 which are electrically coupled to the circuit components within core 40 and arrayed in concentric cap contact patterns 70 (shown in phantom) corresponding in size and location to annular contacts 66. Thus, when floor 63 of recess 64 engages end surface 42 of core 40, regardless of the angular orientation of cap 22, the desired electrical interconnections between cap 22 and core 40 are effected. If a plurality of cap contacts 68 are located on a single cap contact pattern 70, those plural cap contacts will be directly interconnected by the annular contact 66 corresponding to the specific cap contact pattern 70 involved. Connector block 16 may be attached to core 40 in a similar manner.

While core 40 may be a single, self-sustaining structural housing for circuit components, in accordance with an additional teaching of the present invention, core 40 is advantageously comprised of a sequence of congruent plates 71 stacked against and parallel to one another. As better appreciated by reference to FIG. 3, each of plates 71 has a pair of opposed congruent parallel faces and at the periphery thereof sides normal thereto. It is upon these sides of plates 71 individually that contacts 48 are located. Each plate 71 houses one or more circuit components to be interconnected in circuit component assembly 10.

Accordingly, throughout the remainder of this disclosure and in the claims which follow plates 71 will be interchangeably referred to as component carrier packages, and core 40 comprised of component carrier packages 71 will be interchangeably referred to as a carrier package assembly. The faces of different component carrier packages 71 in carrier package assembly 40 are congruent with each other. When assembled to form core 40, component carrier packages 71 are positioned adjacent one to another with faces of adjacent component carrier packages 71 in a mating relationship. In this manner component carrier packages 71 together form a prismatic carrier package assembly 40 having parallel end surfaces 42, 44, sides 46 normal thereto, and a transverse cross-section of that is substantially congruent to the faces of component carrier packages 71. In FIGS. 2 and 3 prismatic carrier package assembly 40 takes the form of a cylindrical solid.

According to another aspect of the present invention register means are provided for aligning component carrier packages 71 with the faces thereof in the desired mating relationship. By way of example, in FIG. 3 successive component carrier packages 71A and 71B have been separated to disclose adjacent faces 72, 74 thereof, respectively. Face 72 of component carrier package 71A is proved at one edge thereof with a set of patterned projecting alignment pins 76 and at the opposite edge thereof with a set of patterned alignment apertures 78. Similarly, adjacent face 74 of component carrier package 71B is provided at opposite edges thereof with a set of patterned alignment pins 80 and a set of patterned alignment apertures 82.

Typically, in assembling component carrier packages 71A and 71B into carrier package assembly 40, alignment pins 76 on component carrier package 71A are received in alignment apertures 82 on component carrier package 71B, while alignment pins 80 are similarly received in alignment apertures 78. This precisely aligns adjacent faces 72, 74 and sides 46 of the constituent component carrier packages 71A, 71B, facilitating use of flexible substrate 50 and other structure described subsequently for the purpose of effecting electrical interconnections between the electrical circuit components in component carrier packages 71A and 71B in a direction parallel to the longitudinal axis of carrier package assembly 40.

Optionally, the fit of alignment pins 76, 80 into alignment apertures 78, 82 may be designed so that successive component carrier packages 71A, 71B snap together and are retained in that relationship for easy handling and further processing. In this same manner the balance of component carrier packages 71 can be readily and precisely assembled one to another. Carrier packages 71 may be fully disassemblable or permanently secured one to the other with a locking adhesive.

In the arrangement shown in FIG. 3 adjacent faces 72, 74 engage one another in a mating relationship which is angularly specific. Nevertheless, under some circumstances angularly non-specific mating between adjacent faces of successive component carrier packages 71 may be acceptable. Then systems of pins and apertures can be devised which, like male fitting 62 and female recess 60, enable alignment to be angularly non-specific. Circumstances may exist which do not require the alignment of the adjacent faces of successive component carrier packages 71. In such cases, fittings such as male fitting 62 and female recess 60 may be omitted. Optionally, the retention of successive component carrier packages 71 in a carrier package assembly 40 may be accomplished exclusively through the use of an encircling circuit board, such as substrate 50.

The electrical interconnection between circuit components housed in successive component carrier packages 71A, 71B are effected, either by the interconnection of contacts 48 on curvilinear sides 46 through contact sites 52 and conductive routing traces 54 on flexible substrate 50, or through the use of mating contacts on faces 72, 74 of each, respectively. Additionally, both means of interconnection may be employed. As shown in FIG. 3, face 72 of component carrier package 71A is provided at the periphery thereof intermediate alignment pins 76 and alignment apertures 78 with a plurality of contacts 84, which are shown in the embodiment illustrated as comprising circular conductive pads that are relatively flush with the surface of face 72. Correspondingly, face 74 of component carrier package 71B is provided with a plurality of similarly configured and patterned contacts 86.

The positioning of contacts 84, 86 is not of substantial significance to their correct functioning, provided that they are electrically interconnected with corresponding circuit components and are brought to bear against each other when the faces on which they appear are in a mating relationship. The form of contacts 84, 86 and of contacts 48 can vary according to design convenience, as will be illustrated in the subsequent embodiment of the invention disclosed hereafter.

Optionally, to enhance the number of interconnection points between successive component carrier packages 71A, 71B, alignment pins 76 and alignment apertures 72 may be interconnected with the circuit component housed within component carrier package 71A. Where alignment pins 80 and alignment apertures 82 on component carrier package 71B are similarly interconnected to the electrical circuit component housed therein, it is then possible, even without the provision of additional contacts, such as contacts 84, 86, to interconnect the circuit components in each of component carrier packages 71A, 71B. Additionally or alternatively, electrical interconnection between adjacent component carrier packages 71 may be effected using cooperating national or international connectors of standard design.

Where component carrier packages 71 are suitably structured, electrical contact effected between adjacent faces, such as adjacent faces 72, 74 of component carrier packages 71A, 71B, respectively, may be sufficient to the requirements of the resulting circuit component assembly. In such cases, additional electrical interconnections parallel to the longitudinal axis of carrier package assembly 40 using cooperating flexible substrate 50 and contacts 48 on curvilinear sides 46 may not be required. Then, all electrical connections between successive component carrier packages 71 will be longitudinal of carrier package assembly 40, and other connections, particularly those circumferentially of carrier package assembly 40 will be effected within each component carrier package 71 individually in a manner to be illustrated subsequently in connection with FIG. 5.

Circumstances may also arise in which the electrical circuit components in one or more component carrier packages 71 in a carrier package assembly 40 need not be electrically coupled to the electrical circuit components in other component carrier packages 71. In such instances, it may nevertheless prove advantageous to stack such component carrier packages 71 adjacent one to another for structural or other reasons dictated by the specific application involved.

Figure 5:
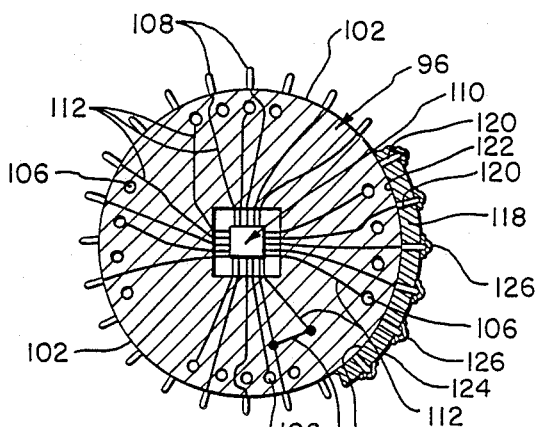
FIG. 5 is a cross-sectional view of the circuit component carrier package shown in FIG. 4 taken along section line 5—5 therein and including in cross-section a portion of a circuit board suitable for use therewith.
Figure 6:
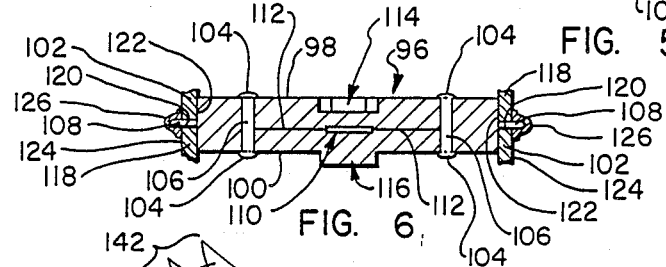
FIG. 6 is a cross-sectional view of the circuit component carrier package shown in FIG. 4 taken along section line 6—6 therein and including in cross-section a portion of a circuit board suitable for use therewith.

A clearer appreciation of the manner in which circuit components are housed in the component carriers of the present invention can be obtained by reference to FIGS. 4, 5, and 6 taken together, which illustrate a second embodiment of a component carrier package 96. Component carrier package 96 is a flattened cylindrical disk having a pair of opposed congruent parallel faces 98, 100 and curved sides 102 therebetween. Faces 98, 100 are provided with a plurality of circular conductive pads 104 which are relatively flush with the surfaces in which they are formed. As seen in FIG. 6, conductive pads 104 on opposite faces 98, 100 of component carrier package 96 are electrically interconnected therethrough by rods 106. In addition, displaced about the circumference of component carrier package 96 projecting from sides 102 thereof in an angularly uniform manner, are a plurality of connector pins 108 which function similarly to contacts 48 on the sides of core 40.

Conductive pads 104 and connector pins 108 afford sturdy electrical interconnections between circuitry exterior to component carrier package 96 and a possibly less sturdy circuit component 110 housed within component carrier package 96. While the circuit components housed in a circuit component carrier package of the present invention could include one or more discrete circuit components, such as resistors, capacitors, transistors, and diodes, as shown by way of example in FIGS. 5 and 6, circuit component 110 comprises an integrated circuit semiconductor chip connected to a plurality of electrical leads 112, which may be printed traces. Leads 112 interconnect circuit component 110 with selective of contacts pins 108 and rods 106. In instances in which electrical interconnections are to be effected circumferentially of component carrier package 96, without the use of connector pins, such as connector pins 108 at the periphery thereof, selected of leads 112 can be interconnected within the body of component carrier package 96 using a circumferentially routed electrical interconnection 113.

In some instances, it may be desirable that the body of component carrier package 96 be hollow, so that circuit components may be installed therein and then enclosed by the sides and faces thereof. In the embodiment shown in FIGS. 4-6, however, circuit component 110 is embedded in the body of component carrier package 96, thereby to produce a rigid, durable composite. The heat generating properties of circuit component 110, as well as other factors relating to the environment in which component carrier package 96 is to function, will dictate the material of which circuit component carrier package 96 is to be comprised. Various electrically non-conductive plastics and ceramics are suitable for use in forming component carrier package 96.

Component carrier package 96 is mechanically secured to and aligned in a mating relationship with an adjacent component carrier package through use of a patterned female receptacle 114 formed in face 98 and a similarly patterned male fitting (not shown) on the adjacent component carrier package. Correspondingly, face 100 of component carrier package 96 is provided with a similarly shaped male fitting 116 that is insertable into a female receptacle on another adjacent component carrier package.

The shape of male fitting 116 and female receptacle 114 ensures an angularly specific mating of faces 98, 100 with adjacent component carrier packages. As shown in FIG. 4, female receptacle 114 and any male receptacle corresponding thereto are trapezoidal in configuration, admitting of only a single angular interconnection. In this manner the correct alignment of conductive pads 104 with similar pads on adjacent component carrier package can be insured.

FIGS. 5 and 6 include in cross-section portions of a flexible circuit board 118 appropriate for use to interconnect connector pins 108 of component carrier package 96, either with each other, or with similar contact pins on other component carrier packages in a carrier package assembly. Contact sites on flexible circuit board 118 for engaging connector pins 108 take the form of a plurality of connector apertures 120 formed through flexible circuit board 118 in a pattern dictated by the pattern of connector pins 108. Connector apertures 120 are selectively interconnected, either on the inner surface 122 of flexible circuit board 118 that engages sides 102 of component carrier 96, or on the outer surface 124 remote therefrom.

Means may be provided to ensure that the reception of connector pins 108 in connector apertures 120 results in a reliable electrical interconnection. For example, the bases of connector pins 108 at sides 102 of component carrier package 96 may be enlarged with a collar which engages a conductive border on inner surface 122 of flexible circuit board 118 about each of connector apertures 120. Alternatively, connector apertures 120 may be lined with a conductive material. As shown in FIGS. 5 and 6, connector pins 108 can be of such a length as to extend through connector apertures 120 to outer surface 124 of flexible circuit board 118. Then the tips of connector pins 108 remote from component carrier package 96 can be individually and permanently interconnected with flexible circuit board 118 by the application thereto of discrete quantities of solder 124.

The housing of circuit components within a component carrier package, such as component carrier package 96, is a highly advantageous arrangement. Delicate circuit components and the leads therefor are thereby protected from damage, but in addition are rendered connectable one to another in a simple, standardized manner using contacts on the exterior of the component carrier package, such as conductive pads 104 and connector pins 108. The interconnection of conductive pads 104 on opposite faces of component carrier packages 96 and the use of a flexible circuit board to engage connector pins 108 on the sides thereof produces an assembly in which numerous circuit components can be densely located in close three-dimensional spatial and electrical proximity relationship.

To accomplish this, the method of the present invention requires only that the circuit components involved are initially housed in a plurality of circuit component carrier packages having sides and normal thereto opposed parallel faces. Advantageously the faces of each component carrier packages are congruent with each other and to the faces of others of the carrier packages. The carrier packages are assembled adjacent one to another with faces in mating engagement to form a prismatic carrier package assembly that itself has parallel ends, sides normal thereto, and a cross-section that is substantially congruent to the faces of the carrier packages. As will be illustrated subsequently, however, the inventive concept disclosed herein includes even carrier package assemblies that are non-prismatic, but which incorporate other teachings disclosed herein pertaining to the invention. Finally, the circuit components in the individual component carrier packages are interconnected as needed on a selective basis, within each component carrier package and between component carrier packages in a direction parallel the longitudinal axis of the carrier package assembly.

The interconnection of circuit components is accomplished using contacts on the sides of each of the carrier packages electrically coupled to the circuit components housed therewithin in cooperation with an encircling circuit board having contact sites in a pattern corresponding to that of the contacts on the carrier packages. Selective of the contact sites are connected with conductive routing traces, and the flexible circuit board is installed about the carrier package assembly against the sides thereof with the contact sites engaging the contacts on the carrier packages. Alternatively or supplementally thereto, the interconnection of circuit components in different carrier packages can be effected by electrically coupling contacts on adjacent faces of successive carrier packages in the carrier package assembly to the circuit components housed therein. The carrier packages are aligned with the contacts on adjacent faces of successive carrier packages engaging one another.

The assembly of the components carrier packages of the invention can be facilitated by the use of patterned alignment pins located on the faces of the carrier packages. The alignment pins are inserted into correspondingly patterned alignment apertures located on adjacent faces of successive component carrier packages in the carrier package assembly. Alternatively, male fittings located on one face can be inserted into correspondingly shaped female receptacles on an adjacent face of a successive carrier package.

The carrier package assembly with circuit components therein may be provided on one end thereof with a connector block that supports the carrier package assembly and interconnects the electrical components thereof with circuitry exterior to the carrier package assembly. Several such carrier package assemblies, supported by connector blocks, can be installed adjacent one to another in the same electronic device.

While component carrier packages 71 of FIGS. 1–3 and component carrier package 96 of FIGS. 4–6 are depicted as being circular plates, the present invention is equally workable using components carrier packages having other configurations. For example component carrier packages of the type already described may be of any convenient polygonal shape and, if congruent, assembled into a prismatic carrier package assembly having a similar transverse cross-section. Alternatively, as will be disclosed below, the component carrier packages need not have congruent cross-sections or result when assembled one with another in a carrier package assembly that is prismatic as that term is used herein.

Figure 7:
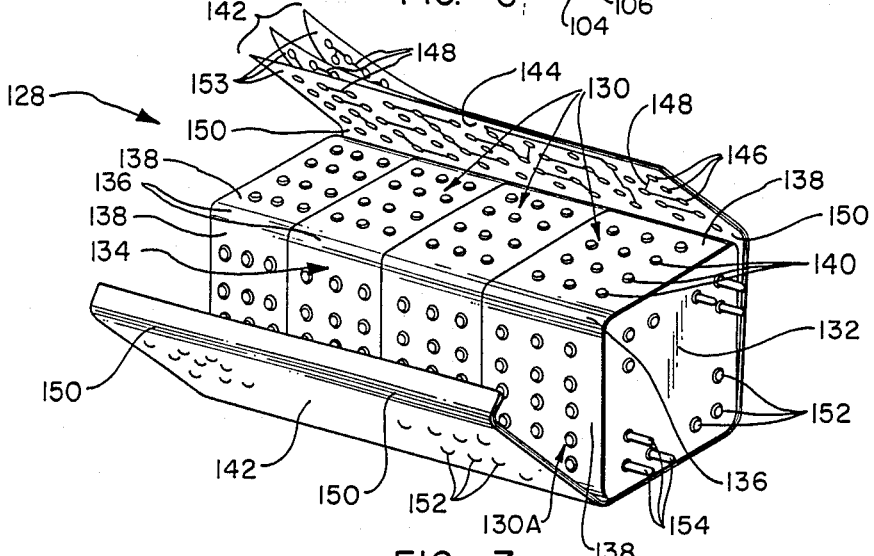
FIG. 7 is a perspective view in partial disassembly of an alternative embodiment of a circuit component assembly according to the teachings of the present invention.

As shown for example in FIG. 7, a circuit component assembly 128 comprises a plurality of component carrier plates or packages 130 each housing one or more circuit components and having rectangular, or more specifically square, opposed parallel faces 132. A plurality of component carrier packages 130 are assembled adjacent one to another with faces 132 thereof in a mating relationship to form a carrier plate assembly 134 in the form of a square column. The corners 136 of component carrier plates 130 where the sides 138 thereof intersect may be rounded as convenient, and sides 138 are provided with a plurality of electrical contacts 140 coupled to the circuit components in each respective component carrier plate 130.

In contrast to the arrangement of contacts 48 on carrier packages 71 in FIGS. 2 and 3, electrical contacts 140 on each component carrier plate 130 are arrayed in a plurality of circumferntially disposed rows. In this manner the number of electrical connections to each component carrier plate 130 may be increased, and such component carrier plates are thus rendered capable of enclosing either a large number of electrical circuit components or large scale integrated circuit semiconductor chips having a substantial number of leads.

Wrapped around carrier plate assembly 134, but shown in a partially opened condition in FIG. 7, is an electrically nonconductive substrate 142 which functions in the same manner as flexible circuit board 118 of FIGS. 5 and 6. On the inner surface 144 of substrate 142 adjacent to sides 138 of component carrier plates 130 are a plurality of contact sites 146 corresponing in pattern to the arrangement of contacts 140. Contact sites 146 are interconnected on a selective basis according to the requirements of carrier plate assembly 134 by conductive routing traces 148.

With polygonal-shaped component carrier packages, such as component carrier plates 130, the substrate used to wrap the resulting carrier plate assembly need not be flexible in every point thereof in order to make adequate physical contact with the sides of the carrier plate assembly. Substrate 142 can thus be relatively rigid at the portions thereof opposing sides 138 of component carriers 13, if yet rendered flexible in the regions 150 corresponding to corners 136. By bending at regions 150, substrate 142 can be otherwise rigid and bring contact sites 146 thereon into engagement with contacts 140, thereby interconnecting the components of carrier plate assembly 134, both about the periphery of each component carrier plate 130 and along the length of carrier assembly 134.

Naturally, substrate 142 may be flexible throughout in the fashion of flexible circuit board 118. Nevertheless, the term "flexible", as used herein in relation to a substrate or circuit board for encircling the sides of a housing enclosing circuit components, should be understood to include a substrate, such as substrate 142, which because of the geometry of the housing it is to encircle need only to be flexible at specific locations in order to adequately engage the sides of that housing.

The precise alignment of substrate 142 and carrier plate assembly 134 can be facilitated by elevating contacts 140 slightly above the surface of sides 138 and forming contact sites 146 in depressions or dimples 152 in substrate 142.

As is frequently the case in fabricating highly densified circuit boards, conductive routing traces 148 on substrate 142 may be arrayed in a plurality of layers in order to facilitate routing. As is illustrated in the case of flexible substrate 50 in FIGS. 1A and 2, such plural layers of conductive routing traces can be formed on opposite sides of a circuit board. In addition, however, as illustrated in FIG. 7, a circuit board, such as substrate 142 can include layers of conductive routing traces other than those on the exterior opposite sides of substrate. Thus, one longitudinal edge of substrate 142 is shown peeled apart to reveal that substrate 142 is a laminate of a plurality of electrically nonconductive strata 153 each supporting one or more layers of conductive routing traces 148.

Once substrate 142 has been assembled so as to wrap sides 138 of component carrier plates 130 in carrier plate assembly 134, the ends of carrier plate assembly 134 can be provided with an appropriate cap and connector block to support carrier plate assembly 134 and interconnect the electrical components therewithin to external electrical components. Toward this end, the exposed face 132 of component carrier plate 130A, has been provided with a plurality of contact pads 152 electrically coupled to the circuit components housed within carrier plate assembly 134 and with pins 154 for alignment purposes. Optionally, pins 154 may be electrically interconnected to the circuit components housed within component carrier plate 130A.

Figure 8:
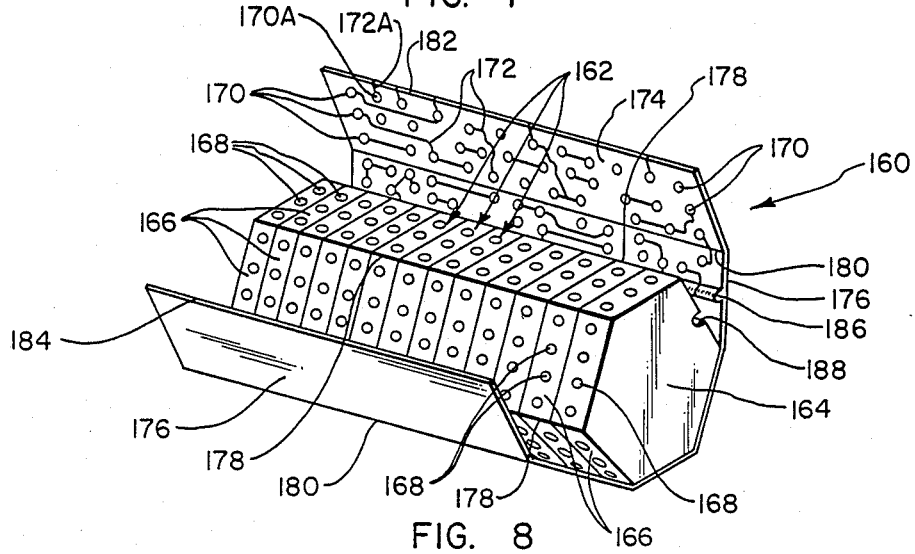
FIG. 8 is a perspective view in partial disassembly of yet another embodiment of a circuit component assembly incorporating teachings of the present invention.

In FIG. 8 is depicted yet another embodiment of a circuit component assembly 160 utilizing circuit component carrier packages 162 having hexagonal faces 164. Component carrier packages 162 are assembled adjacent one to another with adjacent faces 162 in a mating relationship to form a carrier package assembly 163 taking the form of a hexagonal rod. The sides 166 of component carrier packages 162 are provided with a plurality of contacts 168 interconnected with electrical circuit components housed or embedded in component carrier packages 162. In turn, contacts 168 are engaged and electrically interconnected on a selective basis by contact sites 170 and conductive routing traces 172 on the inner surface 174 of a thin substrate 176.

In circuit component assembly 160, the corners 178 where faces 164 of component carrier packages 162 intersect have not been rounded, as were corners 136 in carrier plate assembly 134 of FIG. 7. As a result, substrate 176 need be flexible only in narrow longitudinal regions or folds 180 which coincide with corners 178 of component carrier packages 162. Nevertheless, it should be understood that the expression "flexible", as applied herein to substrates used in the present invention to encircle housings for electrical circuit components, includes substrates, such as substrate 176, which are comprised of relatively rigid sections interconnected by folds which enable that substrate to encircle a carrier package assembly so that opposite edges of the substrate can be brought into electrical contact with each other.

Thus, in the instance of substrate 176, longitudinal edges 182, 184 will meet one another at a seam similar to seam 30 shown in FIG. 1 to create a single continuous member. This aspect of encirclement by a flexible circuit board provides one of the distinct advantages of the present invention, in that the length of the conductive routing traces on substrate 176 that are required to connect contact sites 170 disposed angularly about carrier package assembly 163 is reducable by almost half. For any two angularly displaced contact sites 170, the shorter of the two circumferential routes about carrier package assembly 163 may be used for interconnection purposes. It makes no difference whether that route would require crossing edges 182, 184, since those edges are fused to create a single continuous member at the outside of carrier package assembly 163.

Thus, for example, contact site 170A adjacent to edge 182 of substrate 176 can be connected to a corresponding contact site (not shown) adjacent to edge 184 by a conductive routing trace 172A that crosses edges 182 and 184 when substrate 176 is folded back and joined to itself at edges 182, 184. Were this contact not made, a conductive routing trace connecting the two contact sites involved would necessarily follow a much longer route in the opposite circumferential direction around carrier package assembly 163, along the otherwise unbroken surface of substrate 176. The result is highly advantageous in terms of circuit board design, substantially reducing the complexity of the interconnections between any given number of contact sites.

While component carrier packages 162 may, in the manner of component carrier package 96 of FIG. 4, be provided with register means on faces 164 thereof, the alignment of component carrier packages 162 in carrier package assembly 163 is facilitated to a degree by the polygonal shapes involved. Thus, the flat sides 162 and corners 178 of component carrier packages 162 provide a significant degree of lateral and angular certainty in assembling component carrier packages 162 adjacent one to another. Nevertheless, the resulting alignment is not angularly specific, in that corners 178 of two component carriers 162 could be aligned in any of a number of angularly different orientations.

Accordingly, while the alignment of component carrier packages having polygonal faces is not as difficult as in the case of the alignment of circular component carrier packages, supplemental means may be required to align polygonal component carrier packages, if such register means such as pins and apertures, or male fittings and female recepicals, are not to be utilized. Such supplemental register means can include the provision of visual patterning or color coding on sides 166 of component carrier packages 162. These would indicate to an assembly worker that component carrier packages 162 have been stacked in a correct, angularly specific orientation one to another.

In this regard, in FIG. 8, inner surface 174 of substrate 176 has been provided with a linear alignment rib 186 oriented parallel the longitudinal axis of carrier package assembly 163. Correspondingly, the periphery of each component carrier package 162 includes an alignment groove 188, also oriented parallel the longitudinal axis of carrier package assembly 163. When substrate 176 is wrapped about carrier package assembly 163, precise alignment among component carrier packages 162 is insured by the urging of alignment rib 186 into each of alignment grooves 188.

Figure 9:
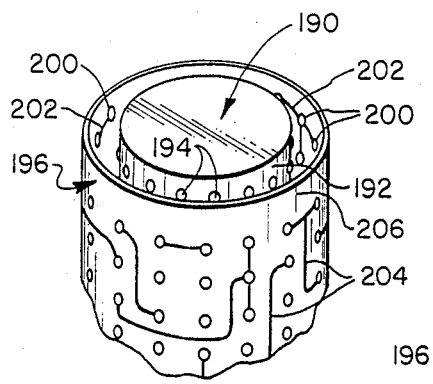
FIG. 9 is a perspective view in partial disassembly of an additional embodiment of a circuit component assembly incorporating teachings of the present invention.
Figure 10:
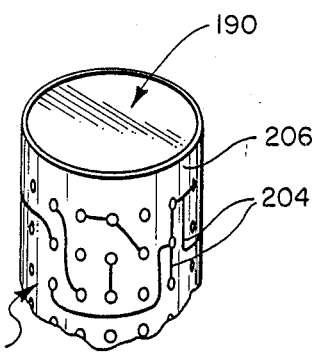
FIG. 10 is a perspective view of the assembled configuration of the circuit component assembly shown in FIG. 9.

Appearing in FIGS. 9 and 10 is an illustration of yet another type of wrapping means used according to the teachings of the present invention to interconnect electrical circuit components in a housing to be encircled by the wrapping means. As shown by way of example and not limitation, an electrical component housing 190 which may or may not be comprised of individual electrical component carrier packages such as those discussed earlier, houses a plurality of electrical circuit components and is provided on the sides 192 thereof with a plurality of electrical contact sites 194. Electrical contact sites 194 are electrically coupled to the electrical circuit components contained in electrical component housing 190 and may take any convenient form, such as those discussed already above. For effecting the selective interconnection between contact sites 194, a tubular substrate 196 is installed about electrical component housing 190 with inner surface 198 of tubular substrate 196 opposing sides 192 of electrical component housing 190. Inner surface 198 is provided with a plurality of electrical contacts 200 which correspond to contact sites 194 on electrical component housing 190. Electrical contacts 200 are selectively interconnected by conductive traces 202. An additional layer of conductive traces 204 are shown on the exterior surface 206 of tubular substrate 196.

Tubular substrate 196 is fabricated of a shrinkable material so as to have an original inner diameter before shrinking that is larger than the outer diameter of electrical component housing 190. Such shrinkable materials include materials permanently skrinkable by exposure to specific chemical conditions or to extremes of hot or cold temperatures. Thus, for example, tubular substrate 196 could be comprised of a conventional heat-shrinkable material. After installation of such a tubular substrate 196 about electrical component housing 190, the application of a threshold amount of heat to tubular substrate 196 would result in the permanent contraction of tubular substrate 196 into tight engagement with sides 192 of electrical component housing 190. In this manner a continuous, seamless wrapping of electrical component housing 190 for the purpose of interconnecting contact sites 194 thereon can be effected as shown in FIG. 10, wherein tubular substrate 196 has been thusly contracted about electrical component housing 190. In the arrangements shown in FIGS. 9 and 10, tubular substrate 196 may, but need not be flexible.

An alternate manner of assembling tubular substrate 196 in close engagement with the exterior sides 192 of an electrical component housing 190 involves fabricating tubular substrate 196 and electrical component housing 190 sized so as to fit tightly together as shown in FIG. 10 at customary operating environment temperature. Thereafter, at least one of the housing or tubular substrate is exposed to an environment at such a temperature as to temporarily modify the size of that component and permit the housing to be inserted within the tubular substrate. Thus, electrical component housing 190 could be cooled, resulting in its contraction to such a degree as to permit electrical component housing 190 to be inserted within tubular substrate 196. Thereafter, a warming of electrical component housing 190 to an operating environment temperature would reverse the contraction resulting in electrical component housing 190 expanding to tightly fit within tubular substrate 196. Alternatively, tubular substrate 196 could be heated, increasing its size to permit the insertion of electrical component housing 190 therein. Then cooling tubular substrate 196 to an operating environment temperature would reverse the expansion of tubular substrate 196, bringing it into tight engagement with electrical component housing 190.

Figure 11:
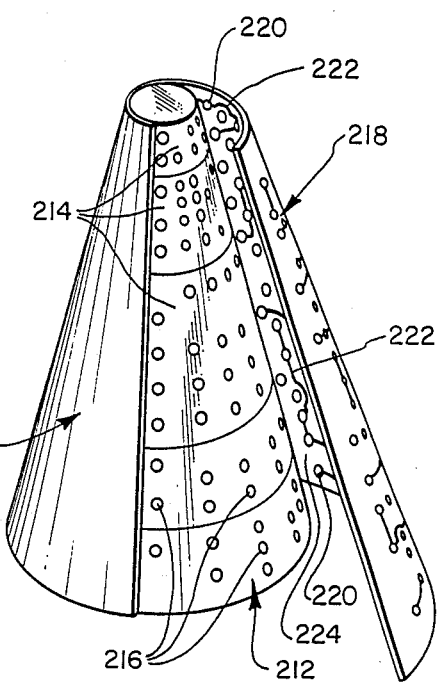
FIG. 11 is a perspective view in partial disassembly of an additional embodiment of a circuit component assembly incorporating teachings of the present invention.

FIG. 11 illustrates yet another circuit component assembly 210 incorporating teachings of the present invention. Circuit component assembly 210 comprises a core carrier package assembly 212 made up of a plurality of carrier packages 214 stacked adjacent one to another. Significantly, carrier package assembly 212 is non-prismatic. Carrier package assembly 112 and each of carrier packages 114 thereof are in the form of conical frustrums, illustrating that the present invention can be obtained using carrier packages that house electrical circuit components but yet are not congruent in cross-section one to another have sides that are not normal to the opposing faces thereof. Additionally, it should be observed that the thickness of carrier packages 214 is not uniform. Nevertheless, the sides of carrier package assembly 112 are provided with a plurality of contact sites 216 electrically coupled to the electrical circuit components housed in each of carrier packages 214.

Circuit component assembly 210 includes a flexible circuit board 218 with electrical contacts 220 and routing traces 222 on the inner surface 224 thereof which faces carrier package assembly 212. As with the other wrapping means disclosed above, flexible circuit board 218 serves to selectively interconnect contact sites 216 on carrier package assembly 212 for the purpose of coupling the electrical circuit components housed therein.

Figure 12:
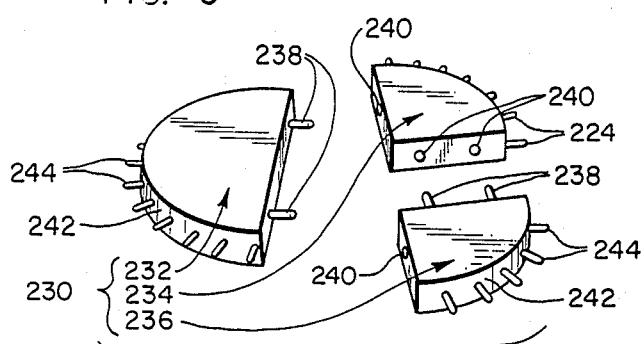
FIG. 12 is a perspective view of the disassembled components of another embodiment of a circuit component carrier package incorporating teachings of the present invention.
Figure 13:
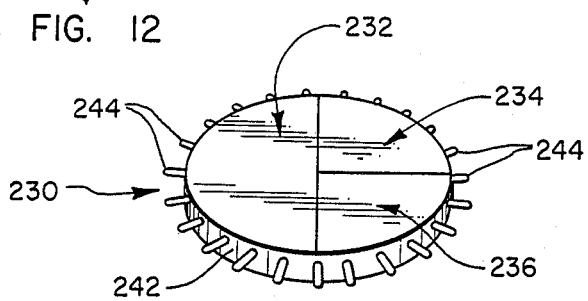
FIG. 13 is a perspective view of the assembled configuration of the circuit component carrier package shown in FIG. 13.

FIGS. 12 and 13 taken together illustrate an optional embodiment of an electrical component carrier package 230 effective in the context of the present invention and employing the teachings thereof. Carrier package 230 is a flattened circular disk comprised of a number of discreet carrier package subcomponents 232, 234, 236 each housing various electrical circuit components. Carrier package subcomponents 232, 234, 236 are joined together to form carrier package 230 by cooperating assembly pins 238 and assembly apertures 240. Assembly pins 238 and assembly apertures 240 may in addition serve to interconnect electrically the electrical circuit components housed in each of the carrier packages subcomponents. For interconnecting those electrical circuit components to others of a carrier package assembly in which carrier package 230 is utilized, the surface of carrier package 230 is provided at sides 242 thereof with a plurality of connector pins 244 which are electrically coupled to the electrical circuit components within carrier package 230.

Figure 14:
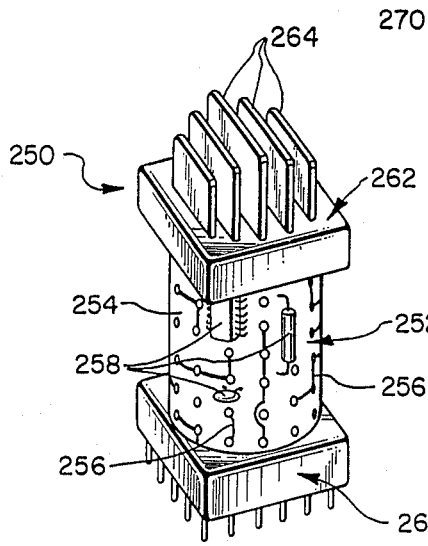
FIG. 14 is a perspective view of another embodiment of a circuit component assembly illustrating additional teachings of the present invention.
Figure 15:
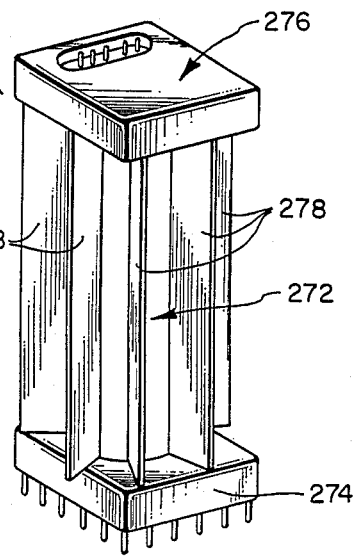
FIG. 15 is a perspective view of an additional embodiment of a circuit component assembly incorporating teachings of the present invention.
Figure 16:
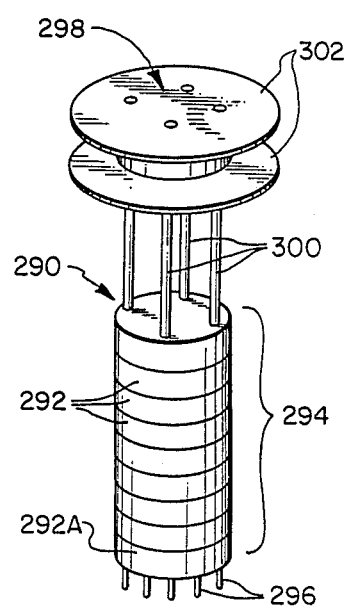
FIG. 16 is a perspective view of a final embodiment of a circuit component assembly incorporating teachings of the present invention.

FIGS. 14–16 illustrate additional aspects of the present invention. FIG. 14 depicts a circuit component assembly 250 comprising a central portion 252 housing electrical circuit components and encircled by a flexible circuit board 254 for enabling electrical interconnections therebetween. The exterior of flexible circuit board 254 includes printed conductive routing traces 256 to which are attached in a conventional manner discreet electrical circuit components 258. The circuit boards of the present invention can thus be utilized to interconnect electrical circuit components not housed in the component carrier package assembly encircled by those circuit boards. Such additional electrical circuit components 258 can merely be attached to printed circuitry on the exterior surface of the circuit board.

One end of central portion 252 of circuit component assembly 250 is provided with a connector block 260 for interconnecting the electrical circuit components in central portion 252 with additional electrical circuitry exterior thereto. The end of central portion 252 opposite from connector block 260 is provided with an end cap 262 having cooling fins 264 thermally coupled to the electrical circuit components within central portion 252. It is the purpose of cooling fins 264 to dissipate from circuit component assembly 252 heat generated by the electrical circuit components therein.

FIG. 15 illustrates a circuit component assembly 270 in which heat generated by the electrical circuit components thereof is dissipated in a different manner. Circuit component assembly 270 includes a central portion 272 having on opposite ends thereof a connector block 274 and an end cap 276. The outer surface of central portion 272 is provided with a plurality of elongated cooling fins 278 disposed parallel to the longitudinal axis of central portion 272. Cooling fins 278 may be attached to a circuit board encircling central portion 272 or thermally coupled, directly or through such a circuit board, to heat-generating electrical circuit components within circuit component assembly 270. Through the circulation of cooling air past cooling fins 278, heat generated by those eletrical circuit components can be dissipated from circuit component assembly 270.

Shown in FIG. 16 is yet an additional circuit component assembly 290 which comprises a plurality of disk-shaped electrical circuit component carrier packages 292 stacked one atop the other in a free-standing cylindrical carrier package assembly 294. The base carrier package 292A in carrier package assembly 294 is provided with installation pins 296 for interconnecting electrical circuit components housed within carrier packages 292 to other electrical circuitry. No circuit board encircles carrier package assembly 294, as all electrical interconnections between the electrical circuit components housed therein are effected through the contacting faces between each adjacent carrier packages 292. At the end of carrier package assembly 294 opposite from base carrier package 292A is a heat-dissipating cap 298 thermally coupled to the electrical circuit components in carrier package assembly 294 by posts 300 that pass longitudinally through carrier packages 292. Heat-dissipating cap 298 is provided with a pair of parallel, disk-shaped cooling fins 302 for accelerating the removal of heat from circuit component assembly 290. Other means of cooling the circuit component assembly, such as circuit component assembly 290 may prove equally effective.

The inventive circuit component assembly enables the densified arrangement of a plurality of circuit components in close spatial disposition and three-dimensional electrical interconnection. The circuit components and the leads associated therewith are securely protected within each of the component carriers packages utilized in the assembly. The impact of such carrier packages with others involves no risk of dislodging leads or damaging the circuit component housed therein. The carrier packages may be thus stacked directly upon one another, eliminating the need for auxiliary support structures and effecting utilizing all of the space between each level of circuit components.

The circuit boards of the present invention, whether rigid and tubular or flexible throughout or at longitudinal regions between otherwise rigid sections, provides dramatic advantages. Less circuit board space is required to interconnect a given number of circuit components than would be the case using a traditional, rigid planar circuit board. The fact that the circuit board of the present invention completely encircles the circuit components with which it is used without a break reduces circumferentially oriented printed wiring on the circuit board by up to fifty percent. Routing traces can travel the shorter of two circumferential paths about the carrier packages involved to connect any two points thereon. Thus, the longest circumferential distance to be traveled by a conductive routing trace is limited to a maximum one half of the dimension in the circumferential direction of the circuit board utilized.

A printed circuit board of cylindrical or other prismatic shape closely approaches a three-dimensional circuit board in cylindrical coordinate form. Conductive routing traces that extend axially of the carrier package assembly can interconnect different layers of the assembly, while conductive routing traces that run circumferentially about the carrier package assembly can interconnect circumferentially disposed contact points contained in planes that are normal to the longitudinal axis of the carrier package assembly.

Additionally, while the placement of circuit components, such as integrated circuit semiconductor chips, on traditional printed circuit boards is a difficult and tedious task, in the inventive circuit component assembly, the uniform spacing of the contact sites on the flexible printed circuit board employed and the embedment in the component carrier packages of the leads for connecting the electrical circuit components, render it possible to effect all electrical interconnections between a plurality of circuit components and the circuit board of the present invention in a single wrapping action. This is far superior to prior methods of interconnecting electrical components using circuit boards. The uniformity of the spacing of contact sites on the circuit board of the present invention also facilitates the manufacture of the circuit board itself.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A three-dimensional component assembly comprising:
    (a) a self-supporting housing enclosing within the sides thereof a plurality of electrical circuit components;
    (b) electrical contacts on said sides of said housing electrically coupled to said components enclosed therein; and
    (c) wrapping means for electrically interconnecting selected of said electrical contacts, said wrapping means comprising:
        i. an electrically insulative substrate encircling said housing against said sides thereof;
        ii. contact sites on said substrate, said contact sites engaging said electrical contacts on said housing when said substrate encircles said housing; and
        iii. electrically conductive routing traces on said substrate selectively interconnecting said substrate selectively interconnecting individual of said contact sites.

2. A three-dimensional circuit component assembly as recited in claim 1, wherein said electrically conductive routing traces on said substrate are arrayed in a plurality of layers.

3. A three-dimensional circuit component assembly as recited in claim 1, wherein said electrically insulative substrate comprises a flexible planar member wrapped around said sides of said housing.

4. A three-dimensional circuit component assembly as recited in claim 1, wherein said electrically insulative substrate comprises a unitary tubular member in tight engagement with said sides of said housing.

5. A three-dimensional circuit component assembly as recited in claim 4, wherein said tubular member is comprised of a material which is permanently contractable by heating into engagement with said sides of said housing.

6. A three-dimensional circuit component assembly as recited in claim 1, wherein said contacts are displaced about said sides of said housing in a uniform manner, and the pattern of said contact sites on said substrate is a uniform matrix.

7. A three-dimensional circuit component assembly as recited in claim 6, wherein said contacts on said housing comprise connector pins extending from said sides of said housing, and said contact sites on said substrate comprise connector apertures for receiving said connector pins when said substrate encircles said housing.

8. A three-dimensional circuit component assembly as recited in claim 7, said connector pins received in said connector apertures pass through said flexible substrate and are soldered thereto from the side of said substrate opposite said housing.

9. A three-dimensional circuit component assembly as recited in claim 8, further comprising a connector block on one end of said housing electrically coupled with said circuit components, said connector block supporting said housing and interconnecting said circuit components with circuitry exterior to said housing.

10. A three-dimensional circuit component assembly as recited in claim 1, wherein said housing comprises a prismatic solid.

11. A three-dimensional circuit component assembly as recited in claim 10, wherein said housing comprises a cylinder.

12. A three-dimensional circuit component assembly as recited in claim 10, wherein transverse cross-section of said housing is polygonal.

13. A three-dimensional circuit component assembly comprising a sequence of stackable carrier packages for electronic circuit components, the carrier packages being positioned adjacent one to another to form a prismatic carrier package assembly having parallel ends and sides normal thereto, each of said carrier packages comprising:
  (a) a carrier plate having an integrated circuit semiconductor chip contained therein, said carrier plate having opposed faces parallel to the plane of the semiconductor chip and sides extending between the peripheries of said faces;
  (b) register means for aligning one of said faces of said carrier plate in a mating relationship with a face of a distinct carrier plate located adjacent thereto in said carrier package assembly;
  (c) a plurality of electrical contacts spaced about the circumference of said carrier plate on said sides thereof, said electrical contacts being so configured and disposed as to be engaged individually by a corresponding number of contact sites selectively interconnected on a flexible circuit board wrapped around said carrier package assembly against said said sides of said carrier plates therein;
  (d) electrical wiring coupling corresponding of the leads of said integrated circuit semiconductor chip to said electrical contacts; and
  (e) an electrical contact on each of said faces of said carrier plate, said electrical contacts being electrically coupled to each other through said plate and being so positioned on each of said faces of said carrier plate as to effect an electrical connection with a distinct carrier plate located adjacent thereto in the carrier package assembly.

14. A three-dimensional circuit component assembly as recited in claim 13, wherein said carrier packages are positioned in said carrier package assembly in a sequence with each of said faces of said carrier packages contacting at most one of said faces of one other of said carrier packages.

15. A three-dimensional circuit component assembly as recited in claim 13, wherein the distance between said faces of each of said carrier packages is equal.

16. A three-dimensional circuit component assembly as recited in claim 13, wherein said faces of each of said carrier packages are congruent.

17. A three-dimensional circuit component assembly as recited in claim 16, wherein said faces of distinct of said carrier packages are congruent.

18. A three-dimensional circuit component assembly as recited in claim 17, wherein adjacent of said faces of successive of said carrier packages in said carrier package assembly are in a mating relationship, and the transverse cross-section of said carrier package assembly is substantially congruent thereto.

19. A three-dimensional circuit component assembly as recited in claim 14, further comprising a connector block on one end of said carrier package assembly electrically coupled with said circuit components, said connector block supporting said carrier package assembly and interconnecting said electrical circuit components thereof with circuitry exterior to said carrier package assembly.

20. A three-dimensional circuit component assembly as recited in claim 14, further comprising a cap thermally coupled to said carrier package assembly and provided with cooling fins for dissipating heat generated by the electrical circuit components in said carrier package assembly.

21. A three-dimensional circuit component assembly as recited in claim 13, wherein said register means comprises a male fitting and a correspondingly shaped female receptacle located respectively on adjacent faces of successive of said carrier packages in said carrier package assembly.

22. A three-dimensional circuit component assembly as recited in claim 13, wherein said register means comprises a system of patterned alignment pins and correspondingly patterned cooperating alignment apertures located respectively on adjacent faces of successive of said carrier packages in said carrier package assembly.

23. A three-dimensional circuit component assembly as recited in claim 22, wherein a first of said alignment pins on a first of said carrier packages is electrically coupled to said circuit component housed therein and a first of said alignment apertures on a second of said carrier packages is electrically coupled to said circuit component housed therein, said first alignment pin being received in said first alignment aperture when said first and second carrier packages are positioned adjacent one to another in said carrier package assembly, whereby said electrical circuit components housed in said first and second carrier packages are electrically interconnected in a direction parallel the longitudinal axis of said carrier package assembly.

24. A three-dimensional circuit component assembly as recited in claim 13, wherein said electrical contacts comprise connector pins extending from said sides of said carrier package assembly.

25. A three-dimensional circuit component assembly as recited in claim 24, further comprising a wrapping means for electrically interconnecting selected of said connector pins, said wrapping means comprising:
(a) a flexible substrate encircling said carrier package assembly against said sides thereof;
(b) contact sites on said substrate, said contact sites engaging said connector pins when said substrate encircles said carrier package assembly; and
(c) electrically conductive routing traces on said substrate selectively interconnecting individual of said contact sites.

26. A three-dimensional circuit component assembly as recited in claim 25, wherein the surface of said substrate opposite from said sides of said carrier package assembly is provided with cooling fins for dissipating heat generated by the electrical circuit components in said carrier package assembly.

27. A three-dimensional circuit component assembly as recited in claim 25, wherein said contact sites comprise connector apertures for receiving said connector pins when said substrate encircles said carrier package assembly.

28. A three-dimensional circuit component assembly as recited in claim 25, wherein said carrier packages comprise circular discs, and said carrier package assembly comprises a cylinder.

29. A three-dimensional circuit component assembly as recited in claim 25, wherein said faces of said carrier packages are polygonal, and said carrier package assembly is a polygonal prism.

30. A three-dimensional circuit component assembly as recited in claim 29, wherein said faces of said carrier packages are square.

31. A three-dimensional circuit component assembly as recited in claim 29, wherein said faces of said carrier packages are hexagonal.

32. A three-dimensional circuit component assembly as recited in claim 13, wherein at least one of said carrier packages comprises a plurality of discreet carrier package subcomponents, each of said carrier package subcomponents housing an electrical circuit component.

33. A three-dimensional circuit component assembly comprising:
(a) a sequence of congruent carrier plates, each of said plates having therein an electrical circuit component and being provided at the periphery thereof with an electrical contact coupled to said circuit component, said carrier plates being stacked against and parallel one to another in a prismatic carrier plate assembly having parallel ends and sides normal thereto;
(b) register means for aligning said plates with said faces thereof in a mating relationship; and
(c) wrapping means for electrically interconnecting said electrical circuit components in a direction parallel the longitudinal axis of said carrier plate assembly, said wrapping means encircling said carrier plate assembly against said sides thereof engaging said electrical contacts and said wrapping means comprising:
  i. an electrically insulative substrate encircling said carrier assembly against said sides thereof;
  ii. contact sites on said substrate, said contact sites engaging said electrical contacts when said substrate encircles said carrier plate assembly; and
  iii. electrically conductive routing traces on said substrate selectively interconnecting individual of said contact sites.

34. A three-dimensional circuit component assembly as recited in claim 33, wherein said register means comprises:
(a) an alignment groove at the periphery of each of said carrier plates oriented parallel the longitudinal axis of said carrier plate assembly; and
(b) a linear alignment rib oriented parallel the longitudinal axis of said carrier plate assembly and urged into each of said alignment grooves by said wrapping means.

35. A three-dimensional circuit component assembly as recited in claim 33, wherein said register means comprises a system of patterned alignment pins and correspondingly patterned cooperating alignment apertures located variously on adjacent faces of successive of said carrier plates in said carrier plate assembly; and wherein a first of said alignment pins on a first of said carrier plates is electrically couple to said electrical circuit component housed therein, and a first of said alignment apertures on a second of said carrier plates is electrically coupled to said electrical circuit component housed therein, said first alignment pin being received in said first alignment aperture when said first and second carrier plates are positioned adjacent one to another in said carrier plate assembly, whereby said electrical circuit components housed in said first and second carrier plates are electrically interconnected in a direction parallel the longitudinal axis of said carrier plate assembly.

36. A three-dimensional circuit component assembly comprising:
(a) a sequence of electrically insulative circuit component carrier packages, each of said carrier packages having a pair of opposed parallel faces congruent with each other and with said faces of other of said carrier packages and having embedded therein an electrical circuit component, said carrier packages being positioned adjacent one to another with said faces of adjacent of said carrier packages in a mating relationship to form a prismatic carrier package assembly having parallel ends and sides normal thereto;
(b) an electrical contact on each of said carrier packages electrically coupled with said electrical circuit component embedded therein, said electrical contacts being located on said sides of said carrier package assembly when said carrier packages are positioned therein; and
(c) a flexible circuit board provided with contact sites and conductive routing traces selectively interconnecting individual of said contact sites, said circuit board encircling said carrier package assembly against said sides thereof with said contact sites engaging said electrical contacts on said carrier packages.

37. A three-dimensional circuit component assembly as recited in claim 36, further comprising a system of patterned alignment pins and correspondingly patterned cooperating alignment apertures located variously on adjacent faces of successive of said carrier packages in said carrier package assembly for aligning said carrier packages.

38. A three-dimensional circuit component assembly as recited in claim 37, wherein a first of said alignment pins on a first of said carrier packages is electrically coupled to said circuit component housed therein and a first of said alignment apertures on a second of said carrier packages is electrically coupled to said circuit component housed therein, said first alignment pin being received in said first alignment aperture when said first and second carrier packages are positioned adjacent one to another in said carrier package assembly, whereby said electrical circuit components housed in said first and second carrier packages are electrically interconnected in a direction parallel the longitudinal axis of said carrier package assembly.

39. A three-dimensional circuit component assembly as recited in claim 37, further comprising a male fitting and a correspondingly shaped female receptacle located respectively on adjacent faces of successive of said carrier packages in said carrier package assembly.

40. A three-dimensional circuit component assembly as recited in claim 36, wherein said carrier packages comprise circular disks, and said carrier package assembly comprises a cylinder.

41. A three-dimensional circuit component assembly as recited in claim 36, wherein said faces of said carrier packages are polygonal, and said carrier package assembly is a polygonal prism.

42. A three-dimensional circuit component assembly, comprising:
   (a) a stack of substantially congruent carrier plates, each of said carrier plates housing an electric circuit component and having a pair of opposed parallel faces, said carrier plates being positioned adjacent one to another with said faces of adjacent of said carrier plates in a mating relationship;
   (b) an electrical contact on each of said faces of said carrier plates, said electrical contacts on said opposed faces of a single of said carrier plates being eletrically coupled therethrough and said electrical contacts on said faces of said plates in said mating relationship engaging one another to interconnect said electrical contacts in a direction parallel to the longitudinal axis of said stack;
   (c) connector pins on said sides of said carrier plates electrically coupled with said electrical circuit components housed therein; and
   (d) a flexible substrate having on a side thereof adjacent said stack contact sites selectively interconnected by electrically conductive routing traces, said substrate encircling said stack against the sides thereof with said contact sites engaging said connector pins to electrically interconnect the electric circuit components in said stack in a direction parallel to the longitudinal axis of said stack.

43. A three-dimensional circuit component assembly as recited in claim 42, wherein at least one of said electrical circuit components is electrically coupled to one of said electrical contacts.

44. A three-dimensional circuit component assembly as recited in claim 42, wherein said carrier plates comprise circular disks, and said stack comprises a cylinder.

45. A three-dimensional circuit component assembly as recited in claim 42, wherein said faces of said carrier plates are polygonal, and said stack comprises a polygonal prism.

46. A three-dimensional circuit component assembly as recited in claim 42, wherein said connector pins are displaced about the circumference of said carrier plates in a uniform manner and the pattern of said contact sites on said substrate is a uniform matrix.

47. A three-dimensional circuit component assembly as recited in claim 46, wherein said connector pins are arrayed in a plurality of parallel rows about the circumference of said carrier plates.

48. A method for assembling a plurality of circuit components in close proximity in a three-dimensional spatial and electrical relationship, the method comprising:
   (a) housing the circuit components in a plurality of circuit component carrier packages having sides and normal thereto opposed parallel faces congruent to each other and to said faces of other of said carrier packages;
   (b) assembling said plurality of carrier packages adjacent one to another with one of said faces of each pair of adjacent carrier packages in mating contact to form a prismatic carrier package assembly having parallel ends, sides normal thereto, and a cross-section substantially congruent to said faces of said carrier packages; and
   (c) selectively interconnecting the circuit components in a direction parallel the longitudinal axis of said carrier package assembly and a direction circumferential thereto.

49. The method as recited in claim 48, wherein said step of interconnecting comprises the steps of:
   (a) coupling electrical contacts about the circumference of said carrier packages on said sides thereof to the circuit components housed therein;
   (b) providing a flexible circuit board having contact sites in a pattern corresponding to the pattern of said electrical contacts;
   (c) connecting selective of said electrical contact sites with conductive routing traces; and
   (d) wrapping said circuit board about said carrier package assembly against said sides thereof with said contact sites engaging said electrical contacts on said carrier packages.

50. The method as recited in claim 48, further comprising the step of electrically coupling said faces of adjacent of said carrier packages in said carrier package assembly, wherein said step of electrically coupling comprises the steps of:
   (a) providing coupling electrical contacts on said opposed faces of said carrier packages;
   (b) coupling said electrical contacts on said opposed faces of each of said carrier packages to each other through said carrier package; and
   (c) aligning said plurality of carrier packages with said electrical contacts on adjacent faces thereof in contact.

51. The method as recited in claim 48, wherein said step of assembling comprises the step of inserting patterned alignment pins located on said faces of said carrier packages into correspondingly patterned cooperating alignment apertures located on adjacent faces of successive of said carrier packages in said carrier package assembly.

52. The method as recited in claim 48, wherein said step of assembling comprises the step of inserting male fittings located on said faces of said carrier packages into correspondingly shaped female receptacles located on adjacent faces of successive of said carrier packages in said carrier package assembly.

53. An electric circuit component carrier package stackable with other similarly configured carrier packages to form a carrier package assembly, said carrier package comprising:
   (a) a carrier plate having an electrical circuit component contained therein, said carrier plate having opposed parallel faces and sides extending between the peripheries thereof;
   (b) register means for aligning one of said faces of said carrier plate with a face of a distinct carrier plate located adjacent thereto in the carrier package assembly;
   (c) a plurality of electrical contacts spaced about the circumference of said carrier plate on said sides thereof, said electrical contacts being so configured and disposed as to be engaged individually by a corresponding number of contact sites selectively interconnected on a flexible circuit board wrapped around said carrier plate against said sides thereof; and
   (e) electrical wiring coupling the electrical circuit component to said electrical contacts.

54. A carrier package as recited in claim 53, further comprising an electrical contact on each of said faces of said carrier plate, said electrical contacts being electrically coupled to each other through said plate and being so positioned on each of said faces of said carrier plate as to effect an electrical connection with a distinct carrier plate located adjacent thereto in the carrier package assembly.

55. A carrier package as recited in claim 53, wherein said electrical circuit component is embedded in said carrier plate.

56. A carrier package as recited in claim 55, wherein the electrical circuit component embedded in said said carrier plate is an integrated circuit semiconductor chip.

57. A carrier package as recited in claim 53, wherein said faces of said carrier plate are circular.

58. A method for assembling a plurality of circuit components in close proximity in a three-dimensional spatial and electrical relationship, the method comprising:
   (a) housing the circuit components in a plurality of carrier plates, said carrier plates each having opposed parallel faces and sides extending between the peripheries thereof;
   (b) assembling said plurality of carrier plates adjacent one to another with one of said faces of each pair of adjacent carrier plates in mating contact to form a prismatic carrier plate assembly having parallel ends, sides normal thereto, and a cross-section substantially congruent to said faces of said carrier plates;
   (c) coupling the circuit components in each of said carrier plates to electrical contacts spaced about said carrier plates on said respective sides thereof;
   (d) providing a flexible circuit board having contact sites in a pattern corresponding to the pattern of said electrical contacts;
   (e) connecting selective of said electrical contact sites with conductive routing traces; and
   (f) wrapping said circuit board about said carrier plate assembly against said sides thereof with said contact sites engaging said electrical contacts on said carrier plates.

59. A method as recited in claim 58, further comprising the step of electrically coupling selected of said routing traces between opposed longitudinal edges of said circuit board wrapped around said carrier packet assembly to provide full-circle routing capacity for wiring traces on said circuit board.

60. A method for assembling a plurality of circuit components in close proximity in a three-dimensional spatial and electrical relationship, the method comprising:
   (a) housing the circuit components in a plurality of carrier plates, said carrier plates each having opposed parallel faces and sides extending between the peripheries thereof;
   (b) assembling said plurality of carrier plates adjacent one to another with one of said faces of each pair of adjacent carrier plates in mating contact to form a prismatic carrier plate assembly having parallel ends, sides normal thereto, and a cross-section substantially congruent to said faces of said carrier plates;
   (c) coupling the circuit components in each of said carrier plates to electrical contacts spaced about said carrier plates on said respective sides thereof;
   (d) providing a tubular circuit board having contact sites on the inside surface thereof in a pattern corresponding to the pattern of said electrical contacts;
   (e) connecting selective of said electrical contact sites with conductive routing traces;
   (f) inserting said carrier plate assembly into said tubular circuit board with said contact sites opposing corresponding of said electrical contacts; and
   (g) shrinking said tubular circuit board into contact with said sides of said carrier plates assembly with said contact sites engaging corresponding of said electrical contacts.

61. A method as recited in claim 60, wherein said tubular circuit board is comprised of a heat-shrinkable material, and said step of shrinking comprises heating said tubular member.

62. A method as recited in claim 60, wherein said step of shrinking comprises the step of cooling said tubular member to the common operating temperature of said tubular member and said carrier packet assembly, whereby reversing expansion of said tubular circuit board caused by the heating of said tubular circuit board above said common operating temperature.

63. A method for assembling a plurality of circuit components in close proximity in a three-dimensional spatial and electrical relationship, the method comprising:
   (a) housing the circuit components in a plurality of carrier plates, said carrier plates each having opposed, parallel faces and sides extending between the peripheries thereof;
   (b) assembling said plurality of carrier plates adjacent one to another with one of said faces of each pair of adjacent carrier plates in mating contact to form a prismatic carrier plate assembly having parallel ends, sides normal thereto, and a cross-section substantially congruent to said faces of said carrier plates;
   (c) coupling the circuit components in each of said carrier plates to electrical contacts spaced about said carrier plates on said respective sides thereof;
   (d) providing a tubular circuit board having contact sites on the inside surface thereof in a pattern corresponding to the pattern of said electrical contacts;

(e) connecting selective of said electrical contact sites with conductive routing traces;

(f) inserting said carrier plate assembly into said tubular circuit board with said contact sites opposing corresponding of said electrical contacts; and (g) expanding said carrier plate assembly into contact with said tubular circuit board with said contact sites engaging corresponding of said electrical contacts.

64. A method as recited in claim 63, wherein said step of expanding comprises the step of warming said carrier plate assembly to the common operating temperature of said tubular member and said carrier plate assembly, whereby reversing contraction of said carrier plate assembly caused by cooling of said carrier plate assembly below said common operating temperature.

* * * * *

UNITED STATES PATENT AND TRADEMARK OFFICE
CERTIFICATE OF CORRECTION

PATENT NO. : 4,833,568

DATED : May 23, 1989

INVENTOR(S) : G. Mark Berhold

It is certified that error appears in the above-identified patent and that said Letters Patent is hereby corrected as shown below:

Column 1, line 14, "unvolve" should be --involve--

Column 5, line 50, sentence should begin a new paragraph
Column 14, line 25, "circumferntially" should be --circumferentially--

Signed and Sealed this

Twenty-fourth Day of December, 1991

Attest:

HARRY F. MANBECK, JR.

*Attesting Officer*  *Commissioner of Patents and Trademarks*